United States Patent
Waki et al.

(10) Patent No.: US 6,282,780 B1
(45) Date of Patent: Sep. 4, 2001

(54) BUMP FORMING METHOD AND ITS FORMING APPARATUS.

(75) Inventors: Eisuke Waki, Kasuga; Tsuyoshi Takata, Fukuoka-ken; Hiroshi Haji, Chikushino, all of (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 360 days.

(21) Appl. No.: 08/796,363

(22) Filed: Feb. 6, 1997

(30) Foreign Application Priority Data

Feb. 8, 1996 (JP) .................................................. 8-022277
Aug. 19, 1996 (JP) .................................................. 8-217020

(51) Int. Cl.⁷ .................................................. H05K 3/32
(52) U.S. Cl. .......................... 29/840; 29/850; 228/180.5; 228/4.5
(58) Field of Search .......................... 29/470, 840, 850; 228/1.1, 110.1, 180.5, 4.5

(56) References Cited

U.S. PATENT DOCUMENTS

| | | |
|---|---|---|
| 3,357,090 * 12/1967 | Tiffany | 29/470 |
| 4,860,433 * 8/1989 | Miura | 29/840 |
| 4,955,523 * 9/1990 | Calomagno et al. | 29/840 |
| 5,014,419 * 5/1991 | Cray et al. | 29/840 |
| 5,438,020 * 8/1995 | Grancher et al. | 29/850 |
| 5,616,520 * 4/1997 | Nishiuma et al. | 29/840 |

* cited by examiner

*Primary Examiner*—Lee Young
*Assistant Examiner*—Rick Kiltae Chang
(74) *Attorney, Agent, or Firm*—Stevens, Davis, Miller & Mosher, LLP

(57) ABSTRACT

In a bump forming method and its forming apparatus, a torch is made to approach a bottom end of a wire extended from a capillary tool to form a ball, thereafter the wire is held by first clampers to lower the capillary tool, and the ball is inserted into the bottom end of the central hole of the capillary tool. Then, the wire is held by the first clampers so that it does not lower and cut by lowering of the capillary tool. Moreover, the capillary tool is further lowered and the ball is pressed against the electrode of a workpiece to bond the ball to the electrode to form a bump. A tail protruded from the bump is crushed by pressing a pressing jig against the tail to make the height of the bump uniform. Thereby, the ball is firmly bonded to the electrode and the joint surface between the ball and the electrode is not damaged.

1 Claim, 18 Drawing Sheets

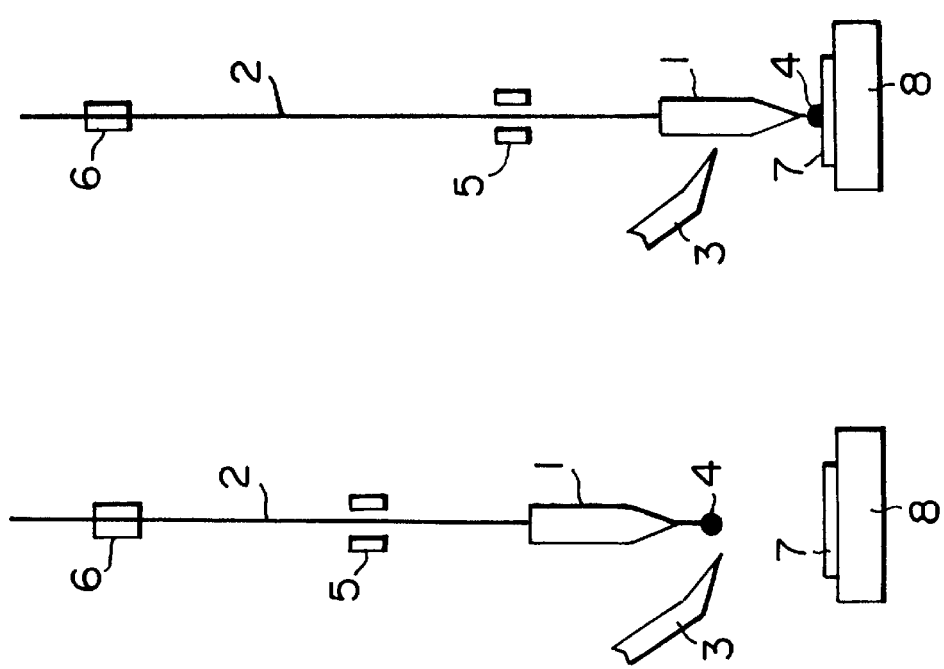
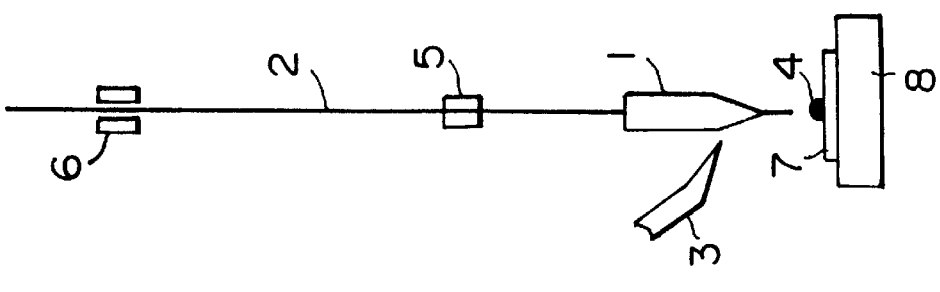
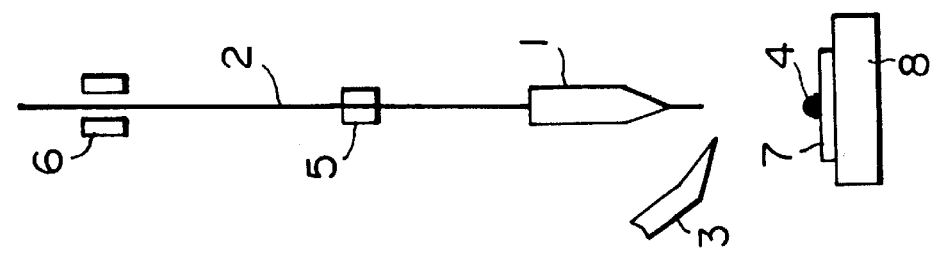
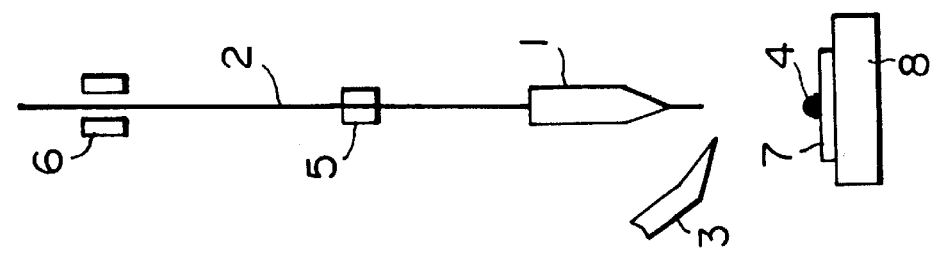
FIG. 19A PRIOR ART
FIG. 19B PRIOR ART
FIG. 19C PRIOR ART
FIG. 19D PRIOR ART

US 6,282,780 B1

BUMP FORMING METHOD AND ITS FORMING APPARATUS.

BACKGROUND OF THE INVENTION

1. Field of the Invention

The present invention relates to a bump forming method for forming a bump on the electrode of a workpiece.

2. Description of the Related Art

A method using the wire bonding technique is known as a method for forming a bump (protruded electrode) on the electrode of a workpiece such as an IC chip. A conventional bump forming method is described below.

FIGS. 19A, 19B, 19C, and 19D, and FIG. 20 are illustrations showing a conventional bump forming method. As shown in FIGS. 19A, a ball 4 is formed at the bottom end of a wire 2 extended from a capillary tool 1 by making a torch 3 approach to the bottom end of the wire 2 and generating spark therebetween. Symbol 5 denotes a first clamper located above the capillary tool 1 to hold the wire 2, and 6 denotes a second clamper located above the first clamper 5 to apply a tension to the wire 2.

Then, as shown in FIG. 19B, the ball 4 is pressed against the electrode of a workpiece 7 by lowering the capillary tool 1. Symbol 8 denotes a base on which the workpiece 7 is mounted. Then, as shown in FIG. 19C, the wire 2 (also referred to as tail) is conducted and extended from the bottom end of the capillary tool 1 by a length necessary to form the next ball by slightly raising the capillary tool 1 and thereafter, the wire 2 is securely held by the first clamper 5. Then, as shown in FIG. 19D, the first clamper 5 and the capillary tool 1 are raised while holding the wire 2 to thereby cut the wire 2 immediately above the ball 4 and thus, a series of operations are completed and the bump 4 is formed on the electrode of the workpiece 7.

FIG. 20 shows an enlarged state in which the ball 4 is bonded to the electrode of the workpiece 7 and then the wire 2 is cut off while holding the wire 2 by the first clamper 5 and raising the wire 2 in the step shown in FIG. 19C. Symbol "A" denotes a cutting line and 1a denotes the central hole of the capillary tool 1 through which the wire 2 is inserted. By raising the wire 2, the wire 2 is forcibly cut at the cutting line "a" immediately above the ball 4. In this case, a large tensile stress is produced on the joint surface between the ball (bump) 4 and the electrode 7a of the workpiece 7. Therefore, there are problems that the ball (bump) 4 is easily removed from the electrode 7a and the joint surface between the ball (bump) 4 and the electrode 7a is easily damaged. In FIG. 20, a black portion at the bottom of the ball 4 is a damaged portion.

SUMMARY OF THE INVENTION

Therefore, it is an object of the present invention to provide a bump forming apparatus and its forming method making it possible to firmly bond the bottom end of a wire to the electrode of a workpiece and prevent the joint surface between the ball (bump) and the electrode from damaging.

Therefore, a bump forming apparatus of the present invention includes a capillary tool for inserting a wire into the central hole, a bonding arm for holding the capillary tool at the front end, a vertical motion mechanism for vertically moving the capillary tool through the bonding arm, a first clamper provided above the capillary tool and capable of holding the wire, a second clamper provided with a clamp portion provided above the capillary tool, vertically moving integrally with the capillary tool, and holding the wire so as to be vertically slidable, a torch for forming a ball by sparks at the bottom end of the wire conducted and extended downward from the central hole of the capillary tool, and interval change means for changing the intervals between the second clamper and the capillary tool.

Moreover, a bump forming method of the present invention includes the step of making a torch approach to the bottom end of a wire inserted into the central hole of a capillary tool and extended downward and generating sparks between the bottom end of the wire and the torch to form a ball at the bottom end of the wire, the step of separating the ball from the wire by lowering the capillary tool relatively to the wire, and the step of further lowering the capillary tool and pressing the ball against the electrode of a workpiece to bond the ball onto the electrode.

Moreover, a bump forming method of the present invention includes the step of making a torch approach to the bottom end of a wire inserted into the central hole of a capillary tool and extended downward and generating sparks between the bottom end of the wire and the torch to form a ball at the bottom end of the wire, the step of making the ball approach the electrode of a workpiece by lowering the capillary tool, the step of holding the wire by a clamper so that the wire does not lower and simultaneously lowering the capillary to separate the ball from the wire, the step of further lowering the capillary tool and pressing the ball against the electrode of the workpiece to bond the ball onto the electrode, and the step of raising the capillary tool and taking out the bottom end of the wire from the bottom end of the capillary tool.

Furthermore, a bump forming method of the present invention includes the step of forming a ball at the bottom end of a wire inserted into the central hole of a capillary tool and extended downward, the step of holding the wire by a clamper so that the wire does not lower and simultaneously lowering the capillary tool to separate the ball from the wire, the step of further lowering the capillary tool and pressing the ball against the electrode of a workpiece to bond the ball onto the electrode, and the step of pressing the upside of the ball bonded onto the electrode of the workpiece by a pressing jig.

BRIEF DESCRIPTION OF THE DRAWINGS

FIGS. 19A to 19D are process diagrams of a conventional bump forming method.

DESCRIPTION OF THE PREFERRED EMBODIMENTS

According to the present invention, a wire is cut before bonding a ball at the bottom end of the wire to the electrode of a workpiece and then the ball is pressed against the electrode of the workpiece to bond the ball onto the electrode, so that the bottom of the ball (workpiece) is not damaged and the ball is firmly bonded to the electrode and thereby, a bump can be formed. Moreover, by pressing the upside of the bump by a pressing jig, a tail protruded from the bump is crushed and the height of the upside of the bump can be made uniform.

Figure 1:
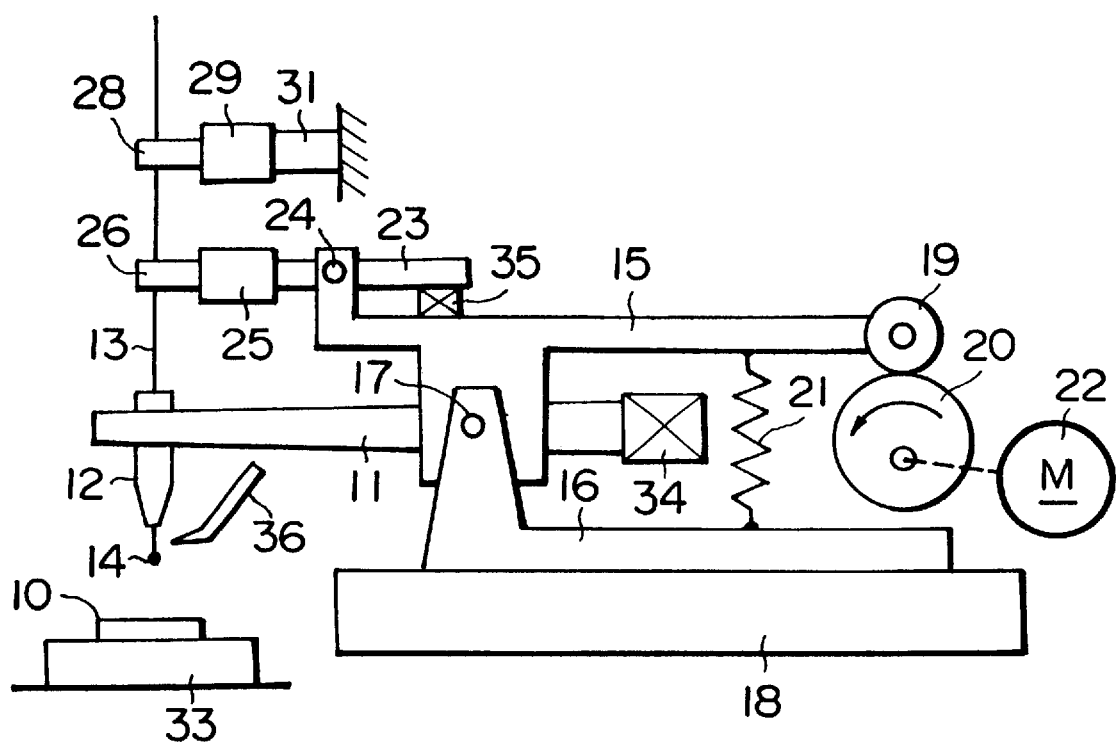
FIG. 1 is a side elevational view of the bump forming apparatus according to an embodiment of the present invention.
Figure 2:
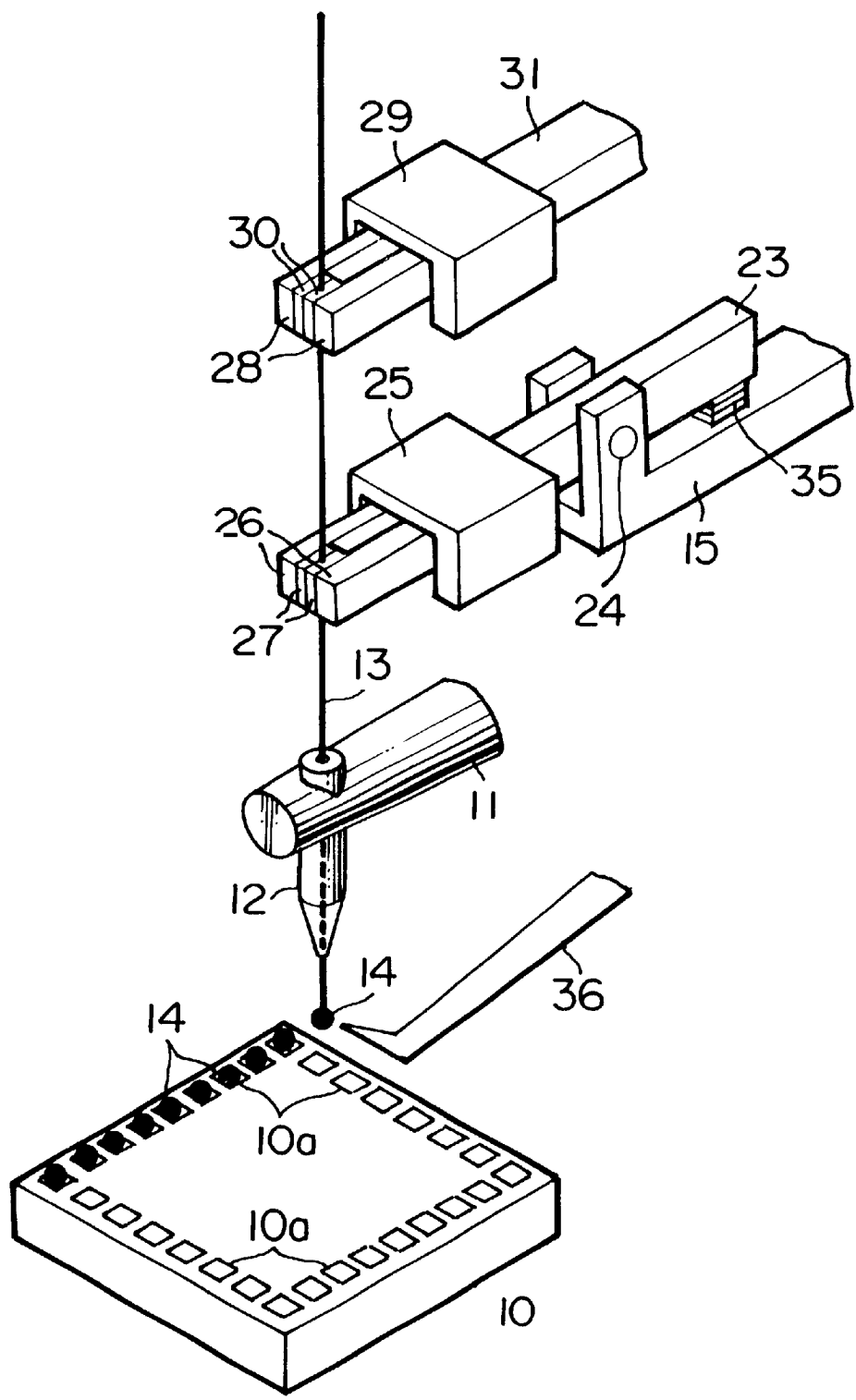
FIG. 2 is a local perspective view of the bump forming apparatus according to an embodiment of the present invention.
Figure 16:
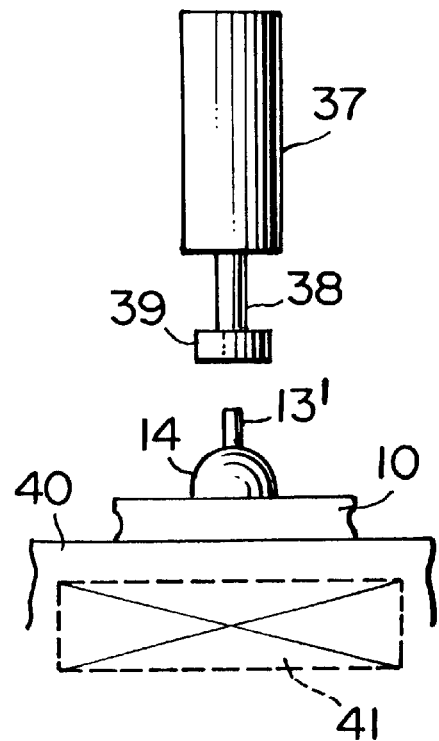
Figure 17:
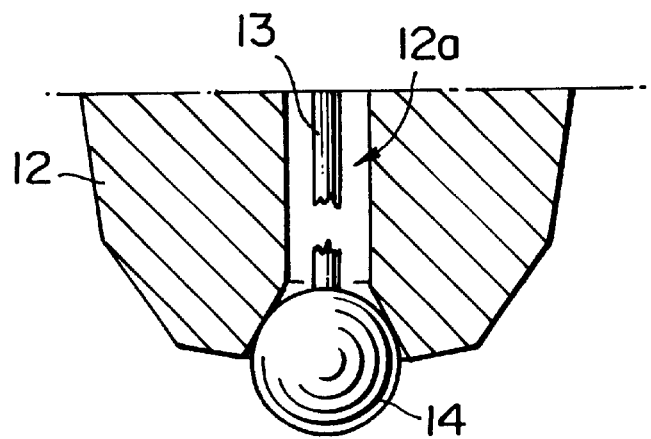
FIG. 17 is a locally enlarged sectional view of a capillary tool when cutting a wire in the process of the bump forming method according to an embodiment of the present invention.

Then, an embodiment of the present invention is described below with reference to the accompanying drawings. FIG. 1 is a side view of the bump forming apparatus according to an embodiment of the present invention and FIG. 2 is a local perspective view of the bump forming apparatus. FIGS. 3 to 16 are process diagrams for forming the bump, which are shown in order of process. Moreover, FIG. 17 is a locally enlarged sectional view of a capillary tool when a wire is cut in the process for forming the bump.

First, the whole structure of a bump forming apparatus is described below by referring to FIGS. 1 and 2. In FIG. 1, symbol 11 denotes a horn (bonding arm) and a capillary tool 12 is held at the front end of the horn. The capillary tool 12 is a hollow cylindrical body and a wire 13 is inserted into the central hole 12a of the tool 12 (see FIG. 17). An ultrasonic generator 34 is mounted to the root of the horn 11. An upward tension is constantly applied to the wire 13 by a not-illustrated tension mechanism.

The horn 11 is journaled to a bearing 16 integrally with a swinging arm 15 so that it can vertically be swung about a pin 17. Symbol 18 denotes a base of the bearing 16. A roller 19 is journaled to the rear end of the swinging arm 15. The roller 19 contacts a cam 20. Symbol 21 denotes an elasticity generation spring for bringing the roller 19 into contact with the cam 20. When a motor 22 is driven and the cam 20 rotates, the swinging arm 15 and the horn 11 integrally vertically swing about the pin 17 and thereby, the capillary tool 12 vertically moves. That is, the roller 19, cam 20, spring 21, and motor 22 serve as a vertical motion mechanism for vertically moving the horn 11 and capillary 12. As the vertical motion mechanism, it is also possible to use a mechanism using a linear motor or voice coil or a mechanism using a ball-screw-type feed mechanism.

A bar 23 is vertically rotatably journaled to a pin 24 at the front end of the swinging arm 15. An actuator 25 is mounted to the front end of the bar 23. In FIG. 2, the actuator 25 holds a pair of right and left second clampers 26. A clamp portion 27 is mounted on an inner surface of the second clampers 26 respectively. When the actuator 25 is driven, the second clampers 26 open or close. While the second clampers 26 close, the clamp portions 27 slightly hold the wire 13. While the wire 13 is held, it can slide in its longitudinal direction (vertical direction). The clamp portions 27 are particularly used so that the wire 13 can vertically slide while it is held and the clamp portions can be constituted with an elastic material such as felt or elastic resin.

In FIG. 1, the rear end of the bar 23 is combined to the upside of the swinging arm 15 through a piezo-electric element 35. The piezo-electric element 35 has a characteristic that it intends and contracts when a voltage is applied. Therefore, when the piezo-electric element 35 contracts, the bar 23 vertically swings about the pin 24. That is, the piezo-electric element 35 serves as interval change means for changing the intervals between the capillary tool 12 and the second clampers. Therefore, by holding the wire by the second clampers to make the capillary tool 12 approach to the second clampers by the interval change means, extension of the tail of the wire 13 (operation for taking out the bottom end of the wire 13 from the bottom end of the capillary tool 12 by a predetermined length) is performed. When the motor 20 is driven and the swinging arm 15 vertically swing, the bar 23 swings integrally with the horn 11 and the second clampers 26 vertically move integrally with the capillary tool 12.

In FIG. 2, first clampers 28 are provided above the second clampers 26. The first clampers 28 is held by an actuator 29, which open or close when the actuator 29 is driven to hold or release the wire 13. A clamp portion 30 mounted on the inner surface of the first clampers 28 respectively is made of a hard member such as stainless steel to firmly hold the wire 13. The actuator 29 is secured to a shaft 31. As shown in FIG. 19, second clampers are conventionally provided above first clampers. In the case of the present bump forming apparatus, however, the second clampers 26 are provided under the first clampers 28 and the above clamp portions 27 are provided for the second clampers 26. Therefore, the above characteristic structure makes it possible to fit a ball 14 to be mentioned later to the bottom end of the central hole 12a of the swinging tool 12 and hold the ball and moreover, take out the tail of the wire 13.

Symbol 36 denotes a torch. By making the front end of the torch 36 approach to the bottom end of the wire 13 extended from the bottom end of the capillary tool 12 and simultaneously applying a high voltage to the torch 36, sparks are generated between the front end of the torch 36 and the bottom end of the wire 13 and the ball 14 is formed at the bottom end of the wire 13. Symbol 10 denotes a chip serving as a workpiece which is mounted on a pedestal 33 (FIG. 1).

As shown in FIG. 2, a plurality of electrodes 1a are formed on the chip 10 and the bump 14 is formed on these electrodes 10a as described later.

Figure 3:
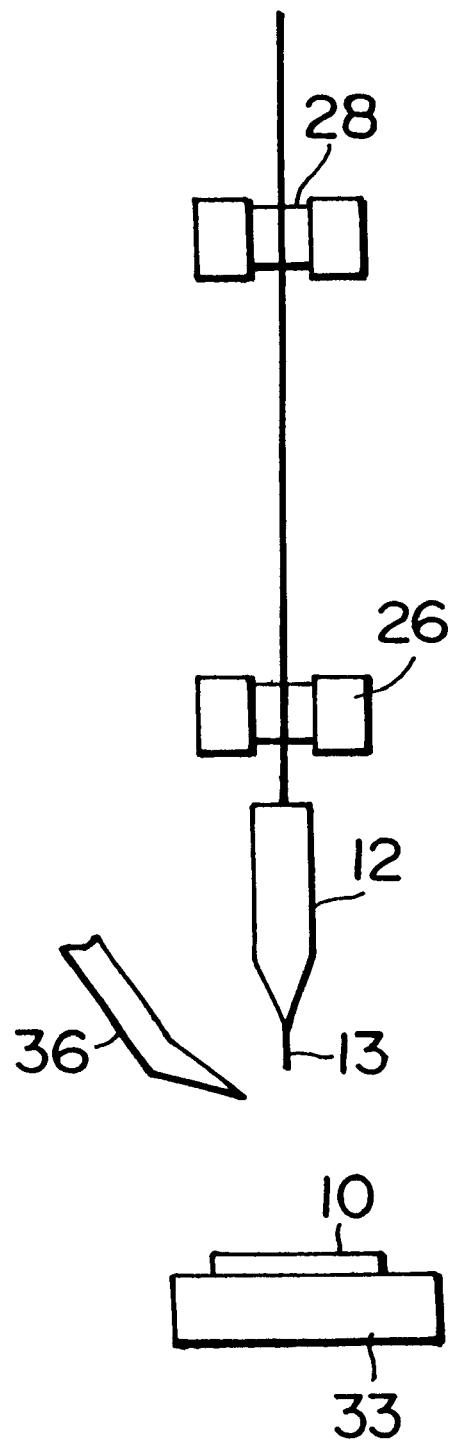
FIGS. 3 to 16 are process diagrams of a bump forming method of the present invention.
Figure 4:
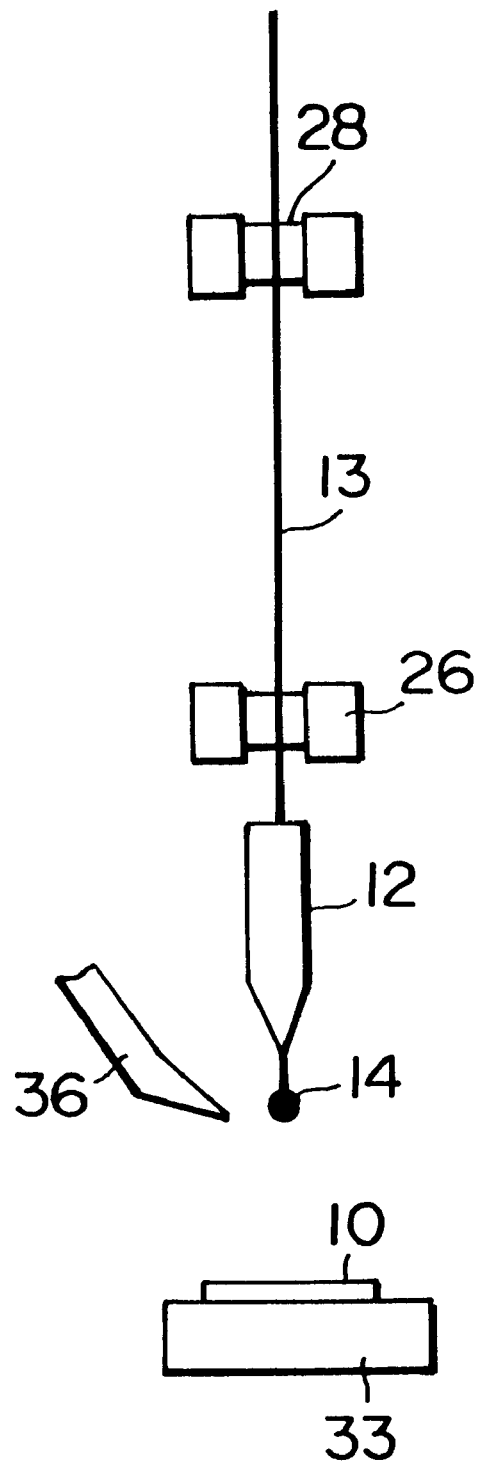
Figure 5:
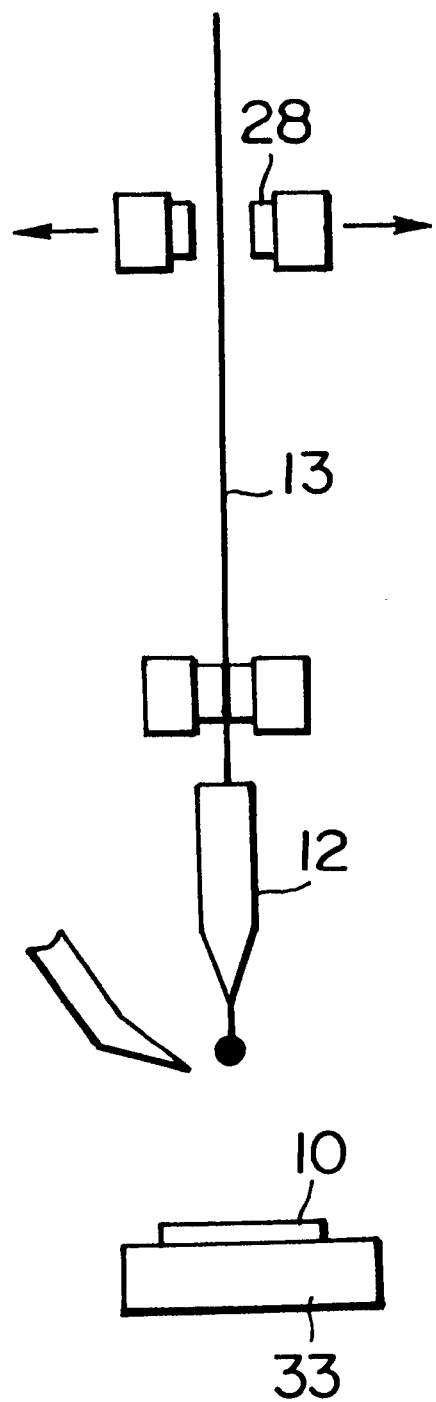

The present bump forming apparatus is constituted as described above. Then, a bump forming method is described below by referring to FIGS. 3 to 17. First, as shown in FIG. 3, the ball 14 with an outside diameter larger than the inside diameter of the central hole 12a of the capillary tool 12 is formed at the bottom end of the wire 13 by making the capillary tool 12 approach the bottom end of the wire 13 while bringing the capillary tool 12 on the chip 10 and then generating sparks between the torch 36 and the bottom end of the wire 13 as shown in FIG. 4. In the case of the steps shown in FIGS. 3 and 4, both the second clampers 26 and the first clampers 28 close and hold the wire 13.

Figure 6:
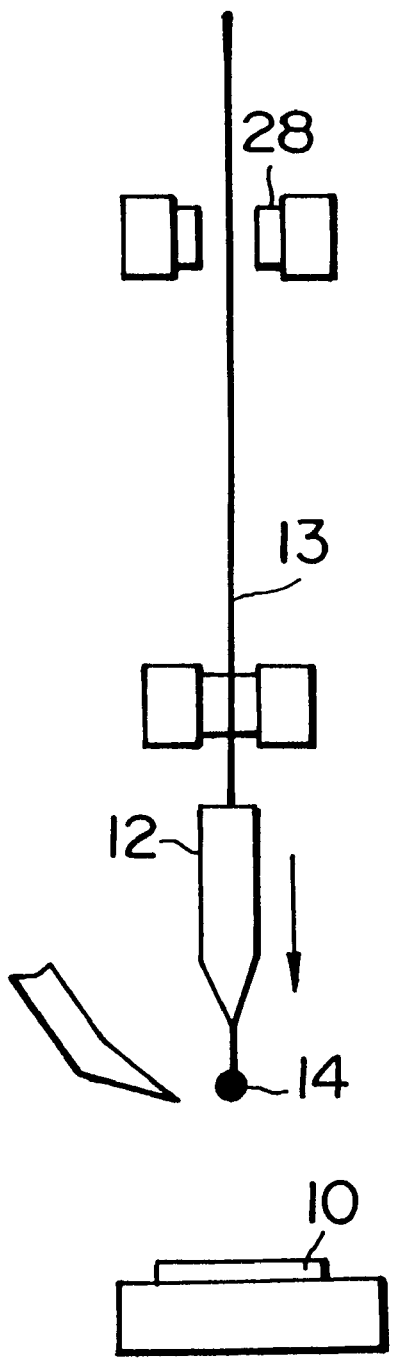

Then, the first clampers 28 are opened to cancel the holding state (FIG. 5) and then, the motor 22 is driven to vertically swing the swinging arm 15. Then, the capillary tool 12 and the second clampers 26 lower toward the chip 10 (FIG. 6). In this case, the piezo-electric element 35 is driven and the second clampers 26 are raised relatively to the capillary tool 12 to increase the interval between the second clampers 26 and the capillary tool 12. The operation of the second clampers 26 is a preparing operation for the step of taking out the tail of the wire 13 to be performed later so that the second clampers 26 can approach the capillary tool 12 by holding the wire 13 in the tail taking-out step.

Figure 7:
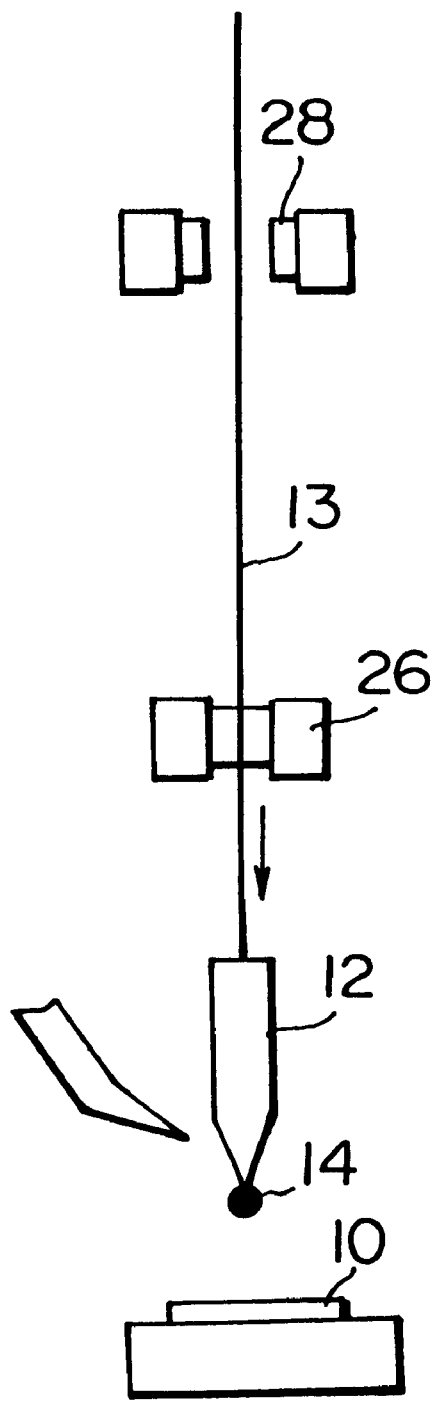

Moreover, according to the operation of the second clampers 26, the wire 13 also rises relatively to the capillary tool 12 so that the ball 14 is fitted into the central hole 12a of the capillary tool 12 (FIG. 7).

Figure 8:
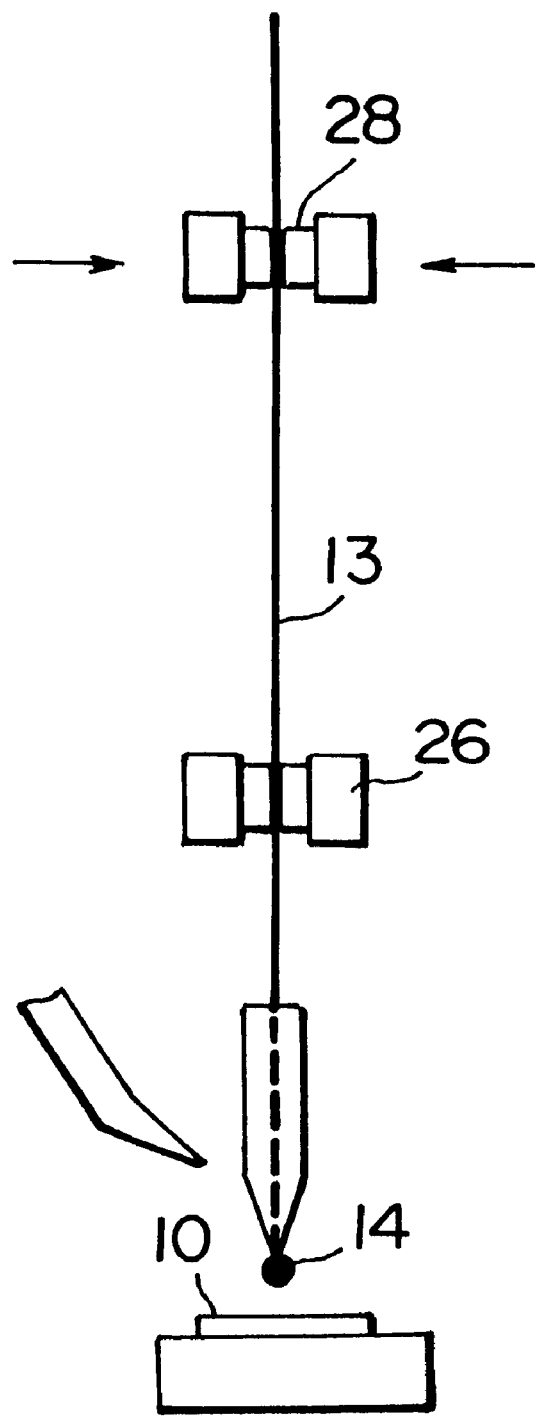
Figure 9:
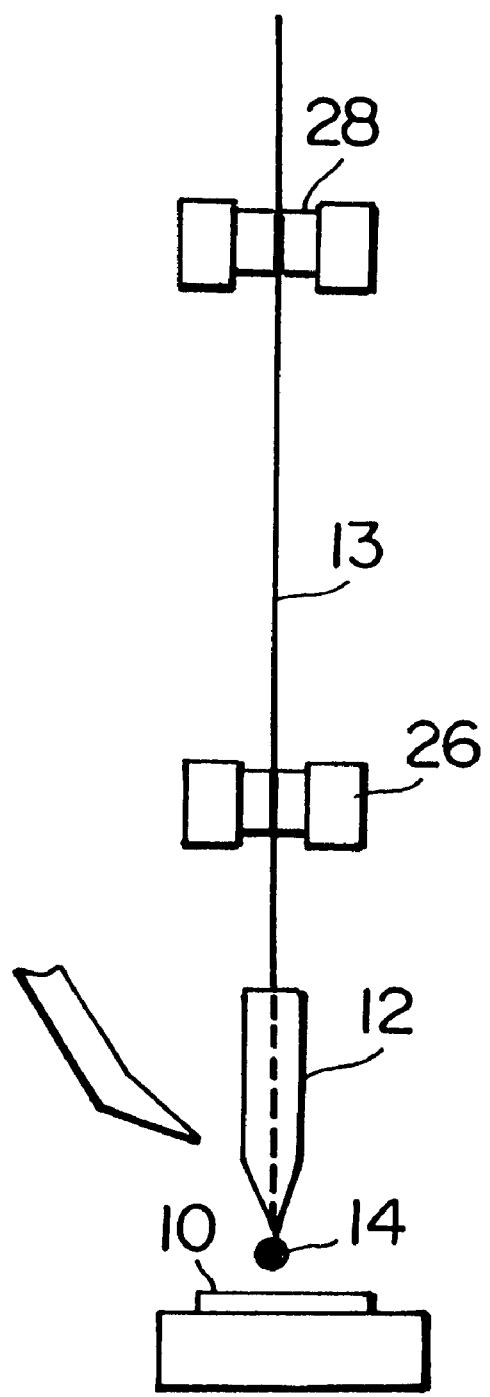

Then, when the ball 14 approaches the workpiece 10, the first clampers 28 close to prevent the wire 13 from lowering (FIG. 8). When the capillary tool 12 further lowers under the above state, the ball 14 is forcibly separated from the wire 13 by the capillary tool 12 because the wire 13 is prevented from lowering by the first clampers 28 (FIG. 9). Of course, the above forcible separation can be performed by firmly holding the wire 13 by the first clampers 28 and raising the wire 13. Anyway, it is important to lower the capillary tool 12 relatively to the ball 14 of the wire 13.

FIG. 17 shows an enlarged sectional view of a portion nearby the bottom end of the capillary tool 12 at the time of the above separation. In the step shown in FIG. 4, the ball 14 is formed at the bottom end of the wire 13 by sparks. At the time of the sparks, the vicinity of the bottom end of the wire 13 is heated to a high temperature due to Joule heat caused by internal current. The ball 14 is formed by the wire 13 melted due to the high temperature. Because the vicinity of the bottom end of the wire 13 is heated to a high temperature, its organization is weakened. Therefore, when a tension is applied to the wire 13, the wire 13 is cut at a portion immediately above the ball 14 shown in FIG. 17. Moreover, as described in the steps shown in FIGS. 6 and 7, the ball 14 is held by fitting to the bottom end of the central hole 12*a* and held.

Figure 10:
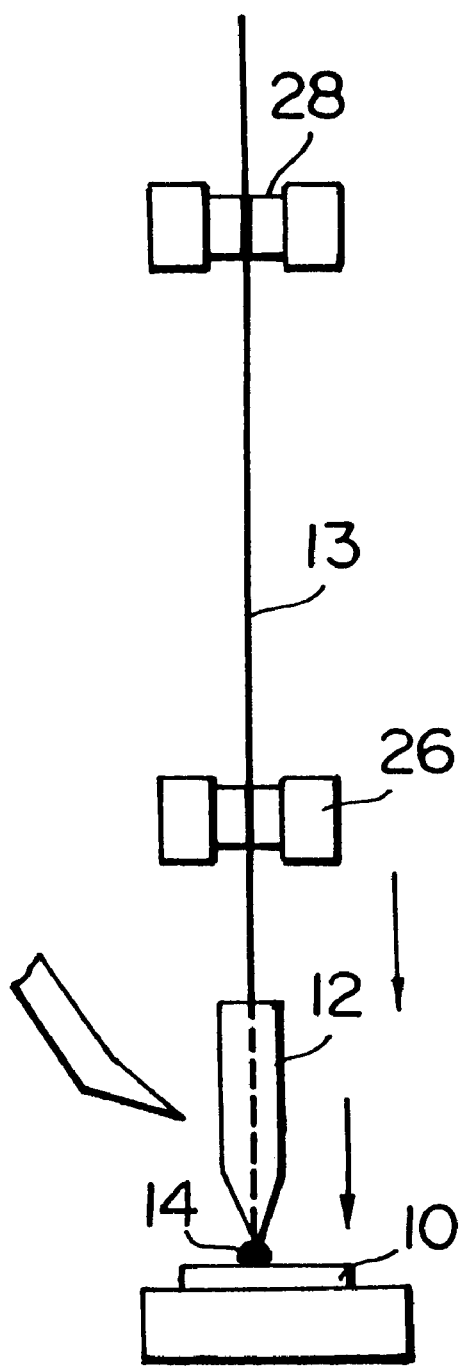
Figure 11:
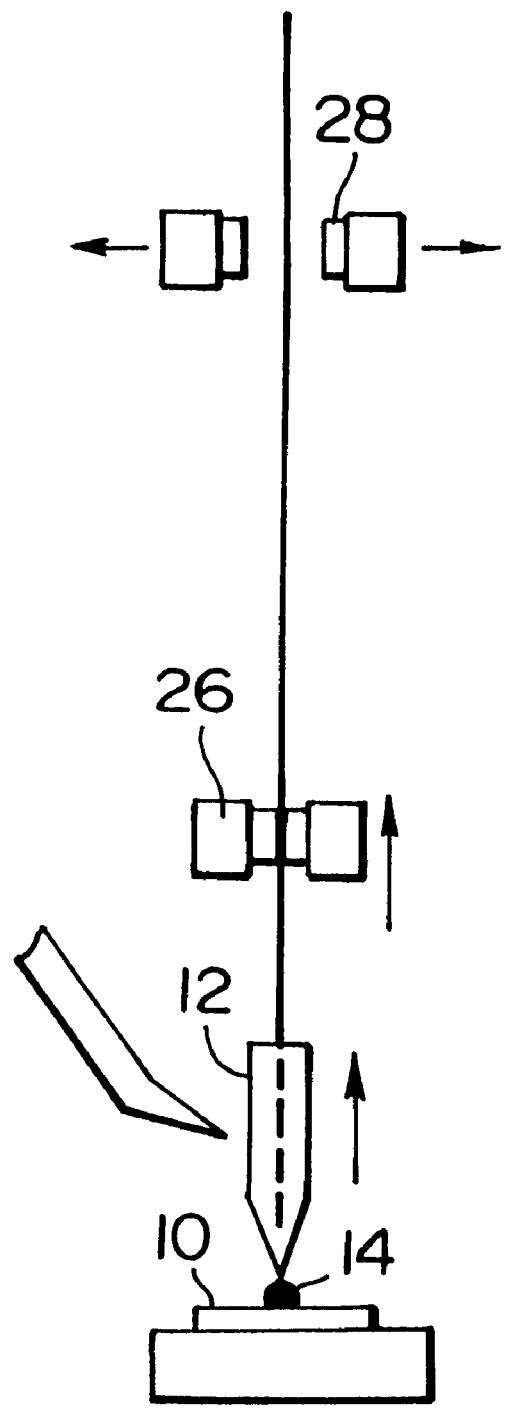
Figure 12:
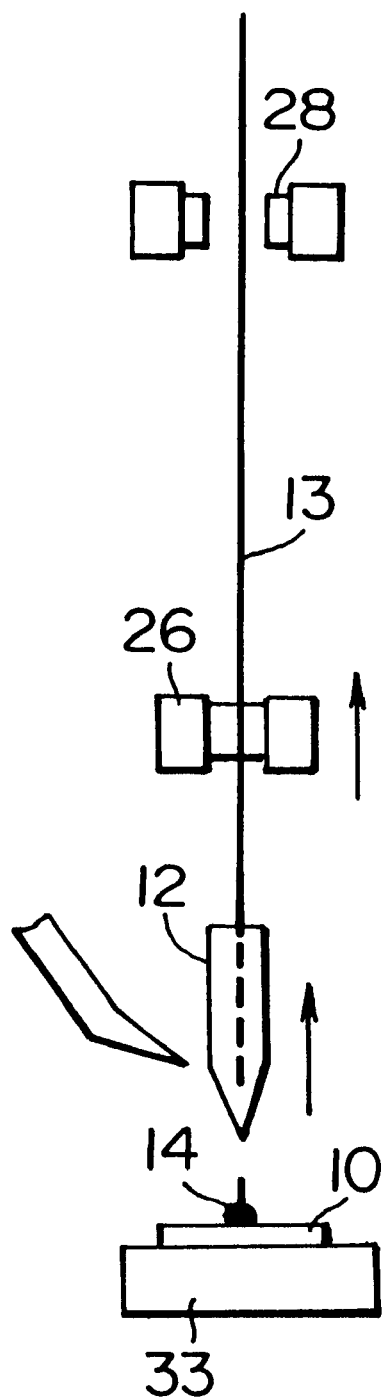

Then, as shown in FIG. 10, the capillary tool 12 lowers and presses the ball 14 against the electrode 10*a* of the chip 10 to bond the ball to the electrode. Then, the first clampers 28 open and thereafter, with the capillary tool 12 and the second clampers 26 integrally rise (FIGS. 11 and 12). Thereby, the bump (ball) 14 is formed on the electrode 10*a* of the chip 10. In this case, the wire 13 is also raised because it is held by the second clampers 26.

Figure 13:
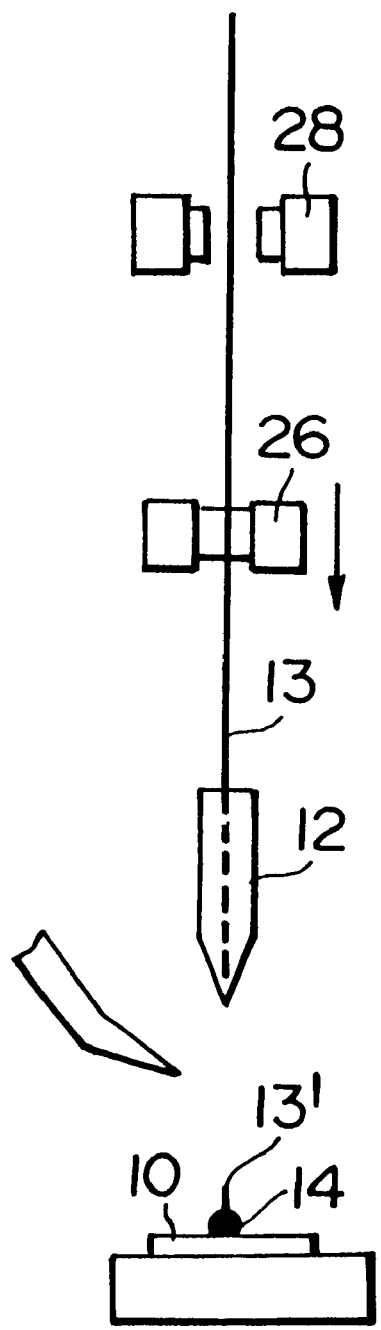
Figure 14:
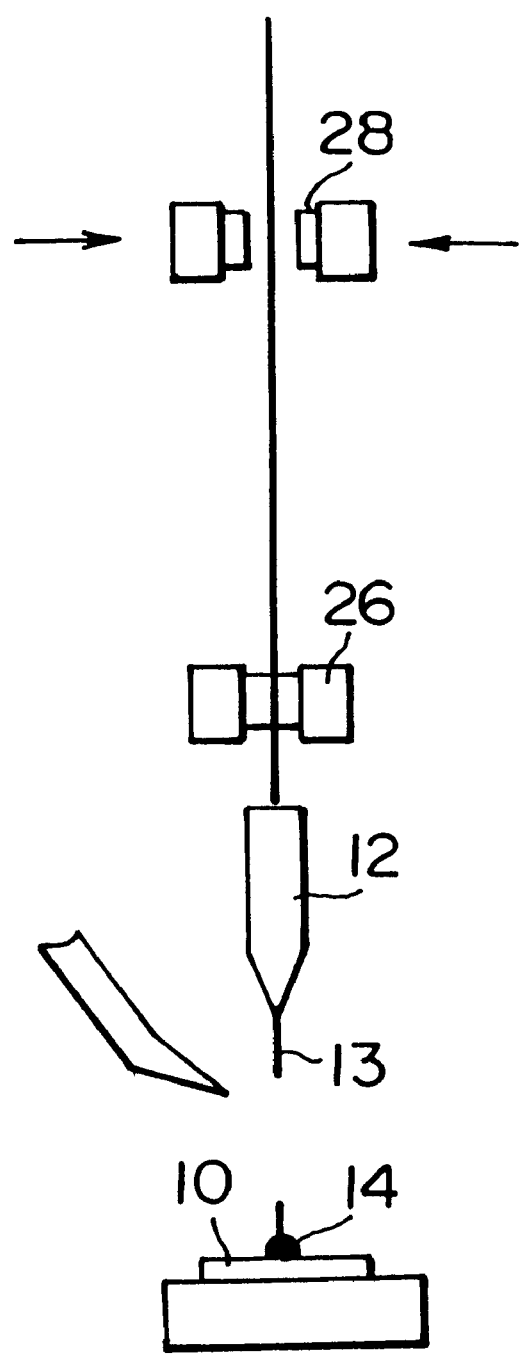

Then, when only the second clampers 26 lower independently of the horn 11 while the first clampers 28 open, the tail of the wire 13 is taken out by taking out the bottom end of the wire 13 from the bottom end of the capillary tool 12 (FIGS. 13 and 14). Then, because the first clampers 28 close, the state returns to the initial state in FIG. 3. Thus, the bump forming operation is completed. As shown in FIG. 2, there are many electrodes 10*a* on the chip 10. Therefore, by repeating the above operation for the chip 10, the bump 14 is successively formed on the electrode 10*a*. In the steps shown in FIGS. 13 and 14, when driving the ultrasonic generator 34 to ultrasonic-vibrate the capillary tool 12, it is easy to extend the wire 13 from the bottom end of the capillary tool 12.

A tail 13' (a broken piece of the wire 13) is easily protruded from the upside of the bump 14 bonded to the workpiece 10 (see FIG. 13). Therefore, as shown in FIG. 16, the tail 13' is crushed to make the height of the bump 14 uniform. In FIG. 16, symbol 37 denotes a cylinder serving as a pressing jig and a pressing plate 39 is provided for the bottom end of the rod 38 of the cylinder. Therefore, by protruding the rod 38 to lower the pressing plate 39, the piece 39 crushes the tail 13'. In this case, by preferably storing a heater 41 in a pedestal 40 with the workpiece 10 mounted on it and heating the workpiece 10 and the tail 13' by the heat of the heater 41, the tail 13' is more easily crushed. In this case, it is necessary to provide a heater in the pedestal 33 when crushing the tail 13' on the pedestal 33 by the pressing jig.

Figure 15:
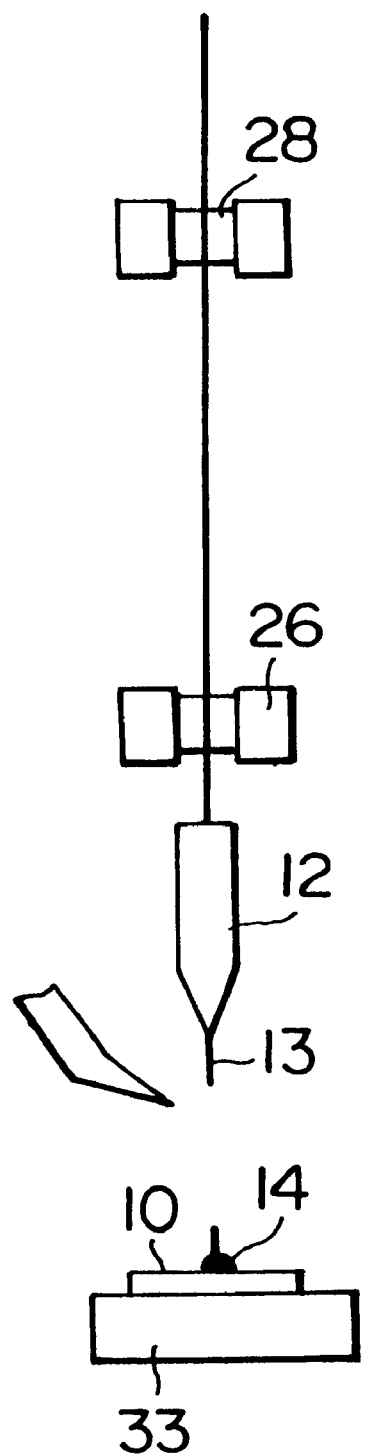
Figure 18:
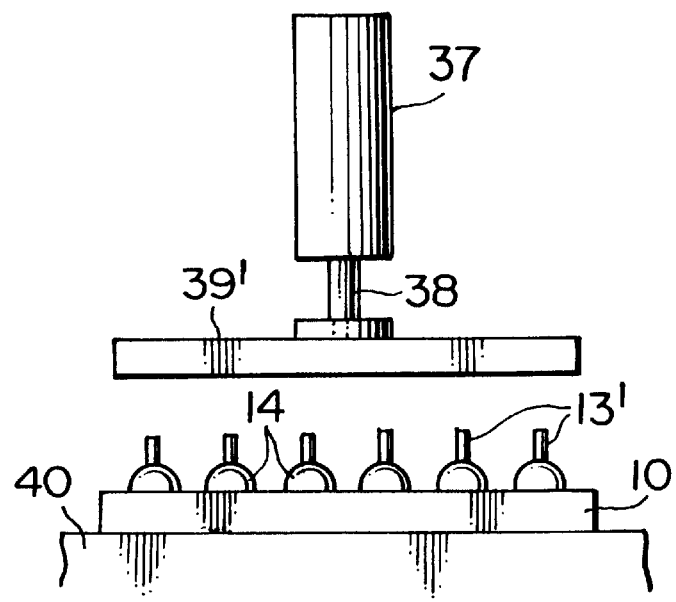
FIG. 18 is a process diagram of the bump forming method according to another embodiment of the present invention.
Figure 20:
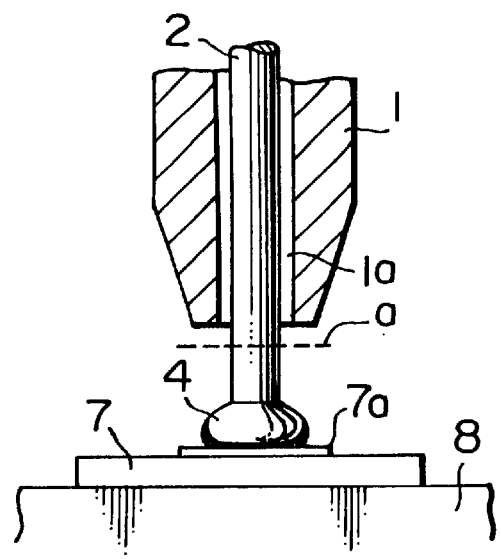
FIG. 20 is a locally enlarged view of the process of a conventional bump forming method.

FIG. 18 is a bump forming process diagram according to another embodiment of the present invention. In the case of FIG. 16, the tail 13' on the bump 14 is crushed by the pressing plate 39 one by one. In FIG. 18, however, tails 13' on a plurality of bumps 14 bonded to the workpiece 10 are simultaneously crushed by a large pressing plate 39'. Also in this case, it is preferable to heat the workpiece 10 and the tails 13' by a heater. The step of crushing the tail (or tails) 13' shown in FIG. 16 or 18 can be performed any time after the step shown in FIG. 15 is completed.

According to the present invention, a wire is cut before a ball at the bottom end of the wire is bonded to the electrode of a workpiece and then, the ball is pressed against the electrode to bond the ball to the electrode. Therefore, the joint surface between the ball (bump) and the workpiece is not damaged and therefore, the ball (bump) can securely be bonded to the electrode of the workpiece.

Moreover, according to the present invention, a bump can be formed without damaging the joint surface between the ball (bump) and the electrode of a workpiece and then, the height of the bump can be made uniform by pressing the upside of the bump by a pressing jig.

What is claimed is:

1. A bump forming method comprising the steps of:

forming a ball at a bottom end of a wire inserted into a central hole of a capillary tool and extended downward by making a torch approach the bottom end of the wire and generating sparks between the bottom end of said wire and said torch;

separating said ball from said wire by lowering said capillary tool relative to said wire; and further lowering said capillary tool and pressing said ball against an electrode of a workpiece to bond the ball to the electrode.

* * * * *